United States Patent [19]

Stakhov

[11] 4,290,050

[45] Sep. 15, 1981

[54] DIGITAL-ANALOG CONVERTER UTILIZING FIBONACCI SERIES

[76] Inventor: Alexei P. Stakhov, prospekt Kosmonavtov, 54, kv. 130, Vinnitsa, U.S.S.R.

[21] Appl. No.: 944,014

[22] Filed: Sep. 20, 1978

[51] Int. Cl.³ .......................................... H03K 13/02
[52] U.S. Cl. ....................... 340/347 DA; 340/347 M
[58] Field of Search ................... 340/347 M, 347 DA

[56] References Cited

U.S. PATENT DOCUMENTS 4,032,979 6/1977 Rice ........................ 340/347 DD X

OTHER PUBLICATIONS

Galalu et al., Number-To-Voltage Converters for (i,k,s) Algorithms, 1975, Proceedings of Higher Educational Institutions, Instrument Designing, Vol. XVIII, No. 4, p. 47, Computer Technology.

*Primary Examiner*—Thomas J. Sloyan
*Attorney, Agent, or Firm*—Steinberg & Raskin

[57] ABSTRACT

A digital-analog converter comprises a reference value adder having its multidigit input coupled to a multidigit output of a switch unit and a Fibonacci p-code convolution unit. The fibonacci p-code convolution unit has its multidigit output coupled to a multidigit input of the switch unit. The Fibonacci p-code convolution unit comprises n stages, each of which, related to a certain bit position in a range from one to n-2, comprises an AND gate and an OR gate. Each of the stages corresponding to bit positions from zero to n-1 comprises a flip-flop, an OR gate and an AND gate. The set and reset inputs of the flip-flop of each stage are coupled, respectively, to the output of the AND gate and to the output of the OR gate. The set input of the flip-flop of the stage of the zero bit position is a counting input of the digital-analog converter. First and second inputs of the OR gate of the stage of the ith bit position are coupled, respectively, to the outputs of the AND gates of the (i+1)th and (i+p+1)th states. First, second and third inputs of the AND gate of the ith stage, beginning with the (p+1)th stage, are coupled, respectively, to the reset output of the flip-flop of the same stage, to the set output of the flip-flop of the (i−1)th stage and to the set output of the flip-flop of the (i−p−1)th stage. The remaining inputs of all the AND gates are joined together to constitute a clock input of the digital-analog converter, where n is the length of the Fibonacci p-code and i=0,1,2, ..., n−1.

1 Claim, 1 Drawing Figure

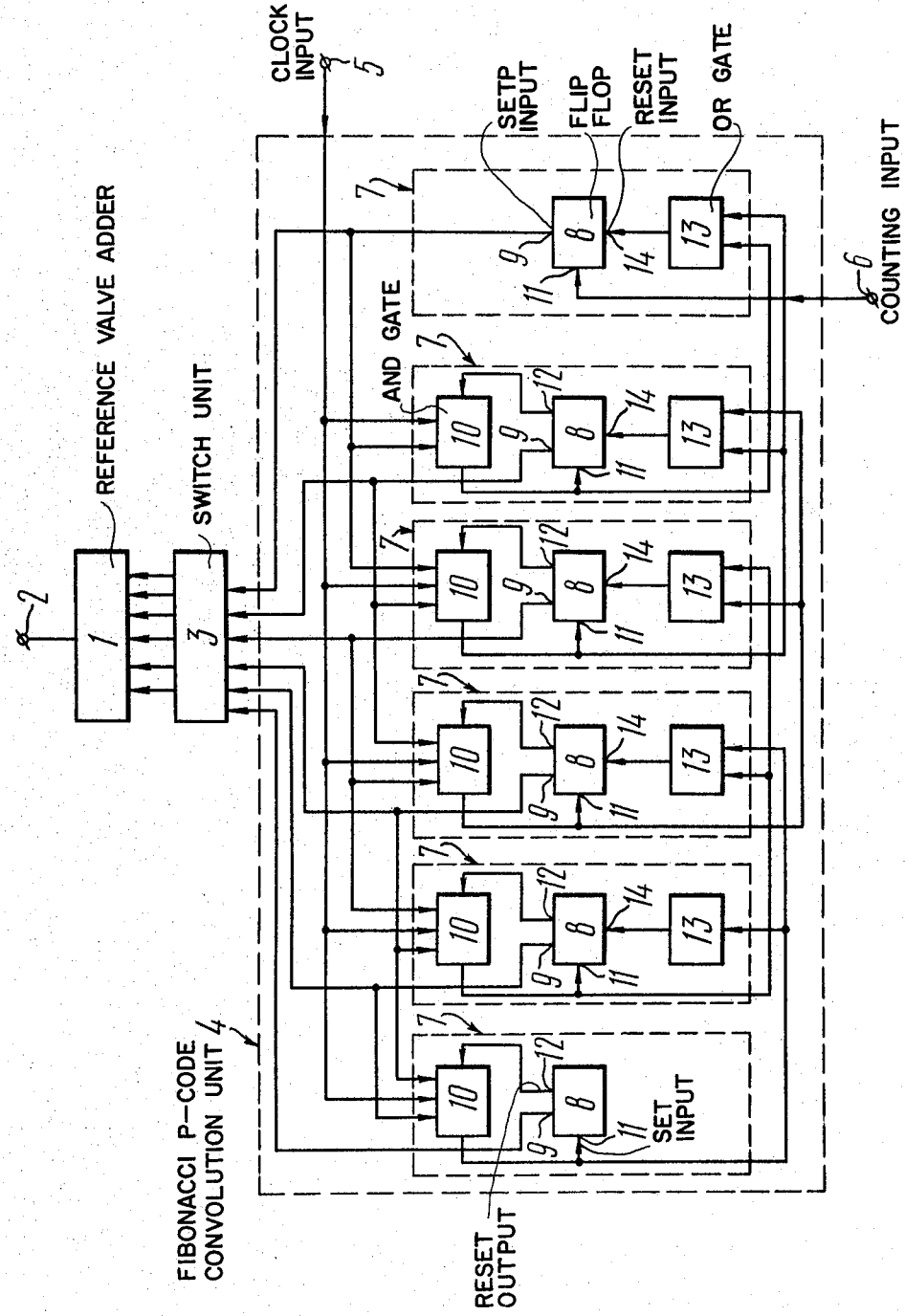

DIGITAL-ANALOG CONVERTER UTILIZING FIBONACCI SERIES

BACKGROUND OF THE INVENTION

The present invention relates to digital instrumentation. More particularly, the invention relates to a digital-analog converter utilizing Fibonacci series.

The invention is suitable for use with analog-digital converters, measuring information systems, and apparatus for displaying data on cathode ray tubes by digital scanning of the beam.

DESCRIPTION OF THE PRIOR ART

Digital-analog converters for generating linearly varying magnitudes (are known in the art, as described in a book by V. B. Smolow et al. entitled, "Semiconductor Encoding and Decoding Converters, "Energya" Publishers, Leningrad, 1967). These digital-analog converters are based on a device which is operated to add the reference magnitudes proportional to the weights of the digits of a conventional binary code subject to digital-analog conversion, and a plurality of switches which control the selection of respective reference magnitudes and have their outputs coupled to respective inputs of the reference magnitude adder. An input codeword is delivered, for example, from a pulse counter having its outputs coupled to the inputs of the switches. The pulse counter may utilize a conventional binary code.

The described digital-analog converters are disadvantageous, since they feature low quality transients occurring at a point in time when adjacent code combinations are changed. Thus, for example, a code combination 011, ..., 1 may be replaced with a code combination 100, ..., 0. The change in code combinations is due to the fact that many switches must be switched over simultaneously for the purpose. These transients therefore result in a powerful surge of current or voltage at the output of such digital-analog converter.

BRIEF SUMMARY OF THE INVENTION

It is an object of the invention to provide for a better quality transient occurring in a digital-analog converter during the changing of adjacent code combinations, by virtue of synchronous control of the transient and diminishment of the number of switches to be switched over simultaneously.

In accordance with the invention, a digital-analog converter comprises a reference value adder having its multidigit input coupled to a multidigit output of a switch unit. A Fibonacci p-code convolution unit has its multidigit output coupled to a multidigit input of the switch unit. The Fibonacci p-code convolution unit has n stages, each related to the ith bit position of a Fibonnaci p-code between the first and (n−2)th bit position of p-code. The Fibonacci convolution unit includes a flip-flop, an AND gate and an OR gate. The stage corresponding to the low-order, zero, bit position of the Fibonacci p-code has a flip-flop and an OR gate. The stage corresponding to the high-order, (n−1)th, bit position of the Fibonacci p-code being provided with a flip-flop and an AND gate. The flip-flop of the stage of the ith bit position, between the first and (n−2)th bit positions, has its set and reset inputs coupled, respectively, to the output of a respective AND gate and to the output of a respective OR gate. The flip-flop of the stage of the low-order, zero, bit position has its reset input coupled to the output of a respective OR gate and its set input is used as a counting input of the digital-analog converter. The flip-flop of the stage of the high-order, (n−1)th, bit position has its set input coupled to the output of a respective AND gate. A plurality of the set outputs of the flip-flops of all the stages constitute the multidigit output of the Fibonacci p-code convolution unit. First and second inputs of the AND gate of the stage of the ith bit position, between the zero and (n−2)th bit positions, are coupled, respectively, to the output of the AND gate of the (i+1)th stage and the output of the AND gate of the (i+p+1)th stage. First and second inputs of the AND gate of the stage of the ith bit position, between the first and (n−1)th bit positions, are coupled, respectively, to the reset output of the flip-flop of the same stage and the set output of the flip-flop of the (i−1)th stage. A third input of the AND gate of the ith stage, beginning with the (p+1)th bit position, is coupled to the set output of the flip-flop of the (i−p−1)th stage. The remaining inputs of all the AND gates are joined together to constitute a clock input of the digital-analog converter, where n is the length of the Fibonacci p-code and i=0,1,2, ..., n−1.

The advantage of the disclosed digital-analog converter is that a transient occurring in it during pulse counting is broken down into a number of local transients each having less power. The local transients are related to at least three bit positions at a time. In the digital-analog converter of the invention, it is possible to control the duration of a transient and to obtain a simpler procedure for a functional check of the converter.

BRIEF DESCRIPTION OF THE DRAWING

The invention will now be described, by way of example, with reference to the accompanying drawing, which is a block diagram of an embodiment of the digital-analog converter of the invention for generating linearly varying values.

DETAILED DESCRIPTION OF THE INVENTION

The digital-analog converter of the invention comprises a reference value adder 1 having an output 2 used as the output of the converter.

The reference values such as, for example, reference currents, are chosen in proportion to respective Fibonacci p-numbers. This means that the weight of the ith bit position is proportional to the ith Fibonacci p-number defined according to a recurrence relationship as follows $$\phi_p(i) = \begin{cases} 0 \text{ at } i < 0 \\ 1 \text{ at } i = 0 \\ \phi_p(i-1) + \phi_p(i-p-1) \text{ at } i > 0 \end{cases} \quad (1)$$

where p is the given number of natural numbers. p is any natural number from 1 to infinity. Each p corresponds to its own series of Fibonacci p-numbers. When for example, p=1, it is 1, 1, 2, 3, 5, 8, 13, 21, ... When p=2, it is 1, 1, 1, 2, 3, 4, 6, 9, 13, 29, ... When p=3, it is 1, 1, 1, 1, 2, 3, 4, 5, 7, 10, 14, 19, ... When p=infinity, it is 1, 1, 1, ..., 1, ...

If it were assumed that p=0, the ∞ series of Fibonacci p-numbers has a classical binary form, 1, 2, 4, 8, 16, ... When p=0, the transition process during the change of adjacent code combination is uncontrolled.

As a result, a parasite peak is produced, affecting the quality of the transition process.

When p is equal to, or greater than, 1, transitions between adjacent code combinations are effected as follows (p=1):

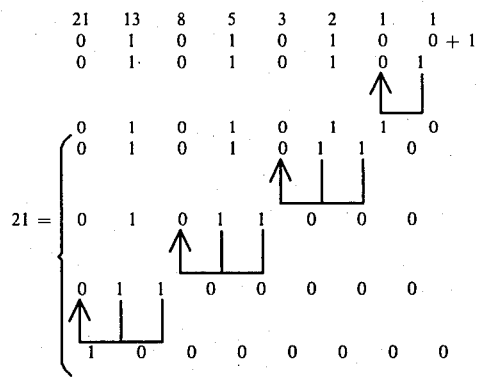

The transition process thus falls into a number of cycles, each involving not more than three digits. As a result, the quality of the transition process improves.

The digital-analog converter of the invention further comprises a switch unit 3 having, for example, transistor switches. The switches of the switch unit 3 are equal in number to the bit positions of the Fibonacci p-code. The outputs of the switches of the switch unit 3 constitute a multidigit output of said switch unit and are coupled to a multidigit input of the reference value adder 1. The digital-analog converter further comprises a Fibonacci p-code convolution unit 4 which performs a step-by-step conversion of the original p-code of a number to other code combinations representing the same number. The multidigit output of the Fibonacci p-code convolution unit 4 is coupled to a multidigit input of the switch unit 3. A first input of the Fibonacci p-code convolution unit 4 serves as a clock input 5 of the digital-analog converter to synchronize transients, whereas a second input of the Fibonacci p-code convolution unit 4 is a counting input 6 of the digital-analog converter to receive count pulses.

In the case of an arbitrary p, the Fibonacci p-code convolution unit 4 comprises n stages 7 equal in number to the bit positions in the Fibonacci p-code. In the illustrated embodiment, n=6. Each ith stage 7 corresponds to the ith bit position of the Fibonacci p-code and comprises a flip-flop 8 whose set input 9 is coupled to the ith bit position of the multidigit input of the switch unit 3. i=0,1,2, ..., n−1. Each stage 7 related to the bit positions between the first and (n−1)th, fifth, bit positions has an AND gate 10 whose output is coupled to a set input 11 of the flip-flop 8. A first input of the AND gate 10 is coupled to a reset output 12 of the flip-flop 8.

Furthermore, each stage 7 corresponding to the bit positions in a range from 0 to n−2 cmprises an OR gate 13. The output of the OR gate 13 of each such stage 7 is coupled to a reset input 14 of the flip-flop 8 of the same stage. A first input of the OR gate 13 of the stage 7 of the ith bit position, with i equal, for example, to 2, is coupled to the output of the AND gate 10 of the stage 7 of the (i+1)th, third, bit position. A second input of the OR gate of the same stage 7 is coupled to the output of the AND gate 10 of the stage 7 of the (i+ +p+1)th, fourth, bit position since p=1 in this case.

A second input of the AND gate 10 of the stage 7 of the ith, second, bit position is coupled to the set output 9 of the flip-flop 8 of the stage 7 of the (i−1)th, first, bit position. The next input of the AND gate 10 of the stage 7 of the ith, second, bit position is coupled to the set output 9 of the flip-flop 8 of the stage 7 of the (i−p−1)th, zero, bit position. The remaining inputs of all the AND gates 10 are joined together to constitute the clock input 5 of the digital-analog converter. The clock input 5 receives clock signals for transients.

The set input 11 of the flip-flop 8 of the stage 7 of the low-order, zero, bit position is the counting input 6 of the digital-analog converter. The counting input 6 receives count pulses.

The operation of the digital-analog converter of the invention, with p=1, is as follows. Count pulses are applied to the counting input 6 of the digital-analog converter. The Fibonacci p-code convolution unit 4 operates to convert a train of count pulses to a respective Fibonacci p-code which appears at the multidigit output of said Fibonacci p-code convolution unit 4 and activates respective switches of the switch unit 3. These switches, in turn, select the reference elements in the reference value adder 1 having values proportional to respective Fibonacci p-numbers. As a result, the output 2 of the reference value adder 1 provides an analog value proportional to the number of pulses, N, applied to the counting input 6. When p=1, the clock rate is twice that of the series digital count signal at the counting input 6.

Within a time interval between two consecutive count pulses such as, for example, first and second count pulses, clock pulses are applied to the clock input 5 to permit a sequential conversion or convolution of the original p-code of a natural number to other code combinations of the same number. In this case, the output 2 provides the same analog value corresponding to the original p-code and selected previously by action of the initial count pulse.

A detailed description of the Fibonacci p-code convolution unit 4 is as follows. Before the operation commences, the flip-flops 8 of all the stages 7 are kept in the 0 state. As a result, enabling signals (logic 1's) available from the reset outputs 12 of the flip-flops 8 are applied to the first inputs of the AND gates 10 and disabling signals (logic 0's) are applied to the second and third inputs of said AND gates. The first count pulse supplied to the counting input 6 causes the flip-flop 8 of the stage 7 of the zero bit position to take up the 1 state, with the result that the following codeword is stored in the Fibonacci p-code convolution unit 4.

5 4 3 2 1 0—nos. of bit positions of Fibonacci 1-code
N=1 0 0 0 0 1—codeword

In the reference value adder 1, the reference value of the zero bit position is selected, $\phi_p(0)=1$, and the output 2 provides the first component of a linearly varying value proportional to N=1.

When a 1 is supplied to the flip-flop 8 of the stage 7 of the zero bit position, an enabling signal (logic 1) produced at the set output of said flip-flop is delivered to the second input of the AND gate 10 of the stage 7 of the first bit position.

A clock signal for synchronizing a transient is a train of short clock pulses having a duration equal to the duration of the transient occurring in the AND gate 10. The time interval between the clock pulses equals the duration of the transient occurring in the digital-analog converter during the switching-on/switching-off of any switch. The first clock pulse is applied to the clock input 5, with a count pulse delivered to the counting input 6, after a time interval equal to the duration of the transient in the digital-analog converter occurring during the switching-on of the switch of the zero bit position.

The first clock pulse applied to the input of the AND gate 10 of the stage 7 of the first bit position causes the appearance of a logic 1 at the output of said AND gate. This results in the flip-flop 8 of the stage 7 of the first bit position being switched to the 1 state. The logic 1 passes through the OR gate 13 of the stage 7 of the zero bit position and causes the flip-flop 8 of said stage of the zero bit position to be switched to the 0 state. As a result, the codeword in the Fibonacci p-code convolution unit 1 assumes the following value.

5 4 3 2 1 0—nos. of bit positions of Fibonacci 1-code
0 0 0 0 1 0—codeword

This codeword also represents the number 1. A transient occurs in the digital-analog converter due to simultaneous switching-on of the flip-flop 8 of the stage 7 of the first bit position and switching-off of the flip-flop 8 of the stage 7 of the zero bit position. After termination of the transient, the output 2 again produces a linearly varying value proportional to $N=1$.

The second count pulse causes the flip-flop 8 of the stage 7 of the zero bit position to be switched to the 1 state with the result that the following codeword is placed in the Fibonacci p-code convolution unit 4.

5 4 3 2 1 0—nos. of bit positions of Fibonacci 1-code
0 0 0 0 1 1—codeword

The reference value of the zero bit position is selected in the reference value adder 1. The output 2 produces the second component of a linearly varying value proportional to $N=2$.

Enabling signals therefore appear at the first, second and third inputs of the AND gate 10 of the stage 7 of the second bit position. The appearance of a clock pulse at the clock input 5 causes the production of a logic 1 at the output of that AND gate 10. This logic 1 causes the flip-flop 8 of the stage 7 of the second bit position to be switched to the 1 state and also causes, via the OR gates 13 of the stages 7 of the first and zero bit positions, the flip-flops 8 of these stages 7 to be switched to the 0 state, thereby resulting in a codeword as follows.

5 4 3 2 1 0—nos. of bit positions of Fibonacci 1-code
0 0 0 1 0 0—codeword

This codeword represents the Fibonacci 1-code of the number N equal to 2. In the digital-analog converter, a transient occurs due to simultaneous switching-on of the flip-flop 8 of the stage 7 of the second bit position and switching-off of the flip-flops 8 of the stages 7 of the first and zero bit positions. After this transient has been terminated, a linearly varying value proportional to $N=2$ appears at the output 2.

After the seventh count pulse and all the clock pulses which follow it, a static state of the Fibonacci p-code convolution unit 4 is as follows.

5 4 3 2 1 0—nos. of bit positions
0 1 0 1 0 0—codeword

This condition corresponds to the Fibonacci 1-code of the number 7. In this case, an analog value proportional to the natural number 7 appears at the output 2.

With the eighth count pulse available, the first intermediate state which the Fibonacci p-code convolution unit 4 assumes is as follows.

5 4 3 2 1 0—nos. of bit positions
0 1 0 1 0 1—codeword

This condition corresponds to the Fibonacci 1-code of the natural number 8. With the first clock pulse available, the Fibonacci p-code convolution unit 4 assumes a new intermediate state as follows.

5 4 3 2 1 0—nos. of bit positions
0 1 0 1 1 0—codeword

This condition corresponds to the second Fibonacci 1-code of the natural number 8. When subsequent count pulses arrive, the operational steps are repeated.

The advantage of the digital-analog converter of the invention is that a transient occurring during pulse counting is broken down into a number of local transients belonging to not more than three bit positions, ith, $(i-1)$ and $(i-p-1)$th, at a time. In addition, it is possible to control the duration of the transient using clock pulses, with the result that the quality of the transient is enhanced and its power is decreased.

In the digital-analog converter of the invention, the appearance of any count pulse causes the switching-on of a single, zero, bit position only and the output of the converter immediately produces a static value corresponding to N, with a concurrent production of a transient. This feature also tends to improve the transient quality and is considered to be important in the case of analog-digital converters with feedback, as used in scanning-type digital measuring systems wherein the digital-analog converter is coupled to the input of a comparator which could produce a false reponse to a transient.

A functional check of the digital-analog converter is a simple procedure as follows. After the current count pulse has been delivered and an output analog value corresponding to N has been selected, it is sufficient to check the output value for constancy each time a clock pulse is applied. A non-constancy of that value may only be due to the fact that the weights of the individual bit positions in the digital-analog converter do not adhere to the recurrence relationship (1). This means that the latter is used as a specific "mathematical checker". If a large deviation from the constancy occurs, trouble is likely to occur in the digital-analog converter.

The implementation of the transient in which the weights of bit positions are subject to a convolution procedure, without changing the numerical equivalent of N, is as follows.

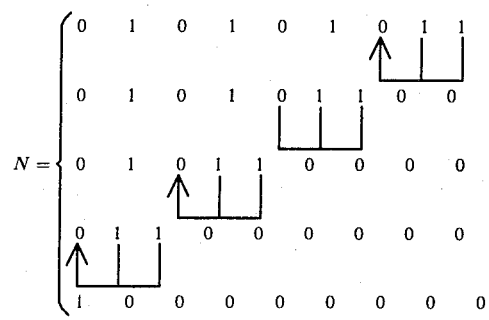

This may be treated as an averaging of the output analog value, which provides for greater accuracy of the digital-analog converter of the invention.

What is claimed is:
1. A digital-analog converter, comprising
   a reference value adder having an output functioning as the output of said digital-analog converter and a multidigit input and producing analog values;

a switch unit having a multidigit input and a multidigit output and selecting respective reference values in said reference value adder; and a Fibonacci p-code convolution unit having a counting input, a clock input and a multidigit output and converting step-by-step the original p-code of a natural number to other code combinations representing that natural number, the multidigit input and the multidigit output of said switch unit being coupled to the multidigit output of said Fibonacci p-code convolution unit and to the multidigit input of said reference value adder, respectively, said Fibonacci p-code convolution unit comprising n stages for converting the bit positions of the original p-code of a natural number, each of said stages corresponding to one of the bit positions of the original p-code, said stages ranging from the lowest order, or zero, bit position, to the highest order, or $(n-1)$th bit position, which are, respectively, referred to as the ith bit positions, where $i = 0, 1, 2, \ldots (n-1)$, p and n are each any natural number from 1 to infinity, the value of each of which is a constant or any given embodiment and wherein n is the length of the Fibonacci p-code, each of the stages of said Fibonacci p-code convolution unit corresponding to the bit positions from 1 to $n-2$ having a flip-flop, an AND gate and an OR gate, all of the AND gates except one having first, second, third, and fourth inputs and an output and said one AND gate having first, second and third inputs and an output and all of the OR gates except one having first and second inputs and an output and said one OR gate having an input and an output, said stage of the low order, zero, bit position having a flip-flop and an OR gate and said stage of the higher order, $(n-1)$th, bit position having a flip-flop and an AND gate, each of said flip-flops having a reset input, a reset output, a set input and a set output, the set and reset inputs of the flip-flop of said stage of the ith bit position being coupled to the output of the AND gate and the output of the OR gate, respectively, of said stage of the ith bit position, the reset input of the flip-flop of said stage of the low order bit position being coupled to the output of the OR gate of said stage of the low order bit position, the set output of the flip-flop of said stage of the low order bit position functioning as the counting input of said digital-analog converter, the set input of the flip-flop of said stage of the high order bit position being coupled to the output of the AND gate of said stage of the high order bit position, and the set outputs of a plurality of the flip-flops of all said stages functioning as the multidigit output of said Fibonacci p-code convolution unit, the first and second inputs of the OR gate of each stage corresponding to the bit positions i to $n-2$ being coupled to the output of the AND gate of the $(i+1)$th stage and the output of the AND gate of the $(i+p+1)$th stage, respectively, the first and second inputs of the AND gate of the ith stage corresponding to the bit positions 1 to $n-1$ being coupled to the reset output of the flip-flop of the same stage and to the set output of the flip-flop of the $(i-1)$th stage, respectively, the third input of the AND gate of the ith stage, beginning with the $(p+1)$th bit position being coupled to the set output of the flip-flop of the $(i-p-1)$th stage, and the remaining inputs of all the AND gates being joined together to constitute a clock input of said digital-analog converter.

* * * * *